(12) United States Patent
Lee

(10) Patent No.: US 9,799,399 B2
(45) Date of Patent: Oct. 24, 2017

(54) NONVOLATILE MEMORY DEVICES INCLUDING CONTROLLER FOR OPERATING NONVOLATILE MEMORY CELL ARRAY LAYER IN MEMORY CHIP IN ONE OF MEMORY MODE AND STORAGE MODE

(71) Applicant: Samsung Electronics Co., Ltd., Suwon-si, Gyeonggi-do (KR)

(72) Inventor: Kwang-Jin Lee, Hwaseong-si (KR)

(73) Assignee: Samsung Electronic Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/298,765

(22) Filed: Oct. 20, 2016

(65) Prior Publication Data

US 2017/0148514 A1   May 25, 2017

(30) Foreign Application Priority Data

Nov. 19, 2015   (KR) ........................ 10-2015-0162601

(51) Int. Cl.
| | |
|---|---|
| *G11C 5/02* | (2006.01) |
| *G11C 13/00* | (2006.01) |
| *G11C 5/04* | (2006.01) |
| *G06F 3/06* | (2006.01) |

(52) U.S. Cl.
CPC ........ *G11C 13/0069* (2013.01); *G06F 3/0604* (2013.01); *G06F 3/0659* (2013.01);
(Continued)

(58) Field of Classification Search
CPC ............ G11C 13/0069; G11C 13/0097; G11C 13/004; G11C 13/0026; G11C 5/04;
(Continued)

(56) References Cited

U.S. PATENT DOCUMENTS

| 7,679,133 B2 | 3/2010 | Son et al. |
| 8,547,769 B2 | 10/2013 | Saraswat et al. |

(Continued)

FOREIGN PATENT DOCUMENTS

| JP | 2012-038393 A | 2/2012 |
| KR | 1519931 B | 5/2015 |

*Primary Examiner* — Thao H Bui
(74) *Attorney, Agent, or Firm* — Harness, Dickey & Pierce, P.L.C.

(57) ABSTRACT

A nonvolatile memory module including a plurality of memory chips and a module controller on a printed circuit board (PCB) may be provided. Each of the plurality of memory chips may include a plurality of nonvolatile memory cell array layers stacked on a substrate in a three dimensional structure. The module controller may control operations of the plurality of memory chips. The module controller may operate each of the plurality of nonvolatile memory cell array layers included in each of the plurality of memory chips in one of a memory mode, in which a corresponding nonvolatile memory cell array layer is used as a working memory area that temporarily stores data for an operation of the nonvolatile memory module, and a storage mode, in which the corresponding nonvolatile memory cell array layer is used as a storage area that preserves data.

6 Claims, 16 Drawing Sheets

(52) U.S. Cl.
CPC .............. *G06F 3/0679* (2013.01); *G11C 5/04* (2013.01); *G11C 13/004* (2013.01); *G11C 13/0026* (2013.01); *G11C 13/0028* (2013.01); *G11C 13/0097* (2013.01)

(58) Field of Classification Search
CPC . G11C 13/0028; G06F 3/0679; G06F 3/0604; G06F 3/0659
USPC .......................................................... 365/51
See application file for complete search history.

(56) References Cited

U.S. PATENT DOCUMENTS

| | | |
|---|---|---|
| 8,553,466 B2 | 10/2013 | Han et al. |
| 8,553,478 B2 | 10/2013 | Yun et al. |
| 8,559,235 B2 | 10/2013 | Yoon et al. |
| 8,654,587 B2 | 2/2014 | Yoon et al. |
| 8,780,651 B2 | 7/2014 | Yan et al. |
| 8,804,410 B2 | 8/2014 | Oh et al. |
| 8,854,881 B2 | 10/2014 | Chevallier et al. |
| 9,058,855 B2 | 6/2015 | Stephens, Jr. |
| 2009/0248962 A1* | 10/2009 | Kim ................... G06F 12/0246 711/103 |
| 2010/0226165 A1 | 9/2010 | Kang et al. |
| 2011/0233648 A1 | 9/2011 | Seol et al. |
| 2012/0210053 A1 | 8/2012 | Norman |
| 2012/0254680 A1 | 10/2012 | Oh et al. |
| 2013/0044538 A1* | 2/2013 | Oh ......................... G11C 11/16 365/158 |
| 2015/0036408 A1 | 2/2015 | Choi |

\* cited by examiner

| NVM1 | USE_V | OP_MD |
|---|---|---|
| MCAL1 | $10^3$ | MEM_MD |
| ⋮ | ⋮ | ⋮ |
| MCALp | $10^5$ | STR_MD |
| NVM2 | USE_V | OP_MD |
| MCAL1 | $10^2$ | MEM_MD |
| ⋮ | ⋮ | ⋮ |
| MCALp | $10^3$ | MEM_MD |
| ⋮ | ⋮ | ⋮ |
| NVMq | USE_V | OP_MD |
| MCAL1 | $10^5$ | STR_MD |
| ⋮ | ⋮ | ⋮ |
| MCALp | $10^6$ | STR_MD |

| NVM1 | END_V | USE_V | OP_MD |
|---|---|---|---|
| MCAL1 | $10^8$ | $3 \times 10^3$ | MEM_MD |
| ⋮ | ⋮ | ⋮ | ⋮ |
| MCALp | $10^7$ | $2 \times 10^5$ | STR_MD |
| NVM2 | END_V | USE_V | OP_MD |
| MCAL1 | $10^8$ | $2 \times 10^2$ | MEM_MD |
| ⋮ | ⋮ | ⋮ | ⋮ |
| MCALp | $10^7$ | $4 \times 10^2$ | MEM_MD |
| ⋮ | ⋮ | ⋮ | ⋮ |
| NVMq | END_V | USE_V | OP_MD |
| MCAL1 | $10^8$ | $3 \times 10^5$ | STR_MD |
| ⋮ | ⋮ | ⋮ | ⋮ |
| MCALp | $10^7$ | $2 \times 10^6$ | STR_MD |

| NVM1 | tWTRSC |
|---|---|
| MCAL1 | a1-1 |
| ⋮ | ⋮ |
| MCALp | a1-p |
| NVM2 | tWTRSC |
| MCAL1 | a2-1 |
| ⋮ | ⋮ |
| MCALp | a2-p |
| ⋮ | ⋮ |
| NVMq | tWTRSC |
| MCAL1 | aq-1 |
| ⋮ | ⋮ |
| MCALp | aq-p |

| NVM1 | CW |
| MCAL1 | cnt1-1 |
| ⋮ | ⋮ |
| MCALp | cnt1-p |
| NVM2 | CW |
| MCAL1 | cnt2-1 |
| ⋮ | ⋮ |
| MCALp | cnt2-p |
| ⋮ | ⋮ |
| NVMq | CW |
| MCAL1 | cntq-1 |
| ⋮ | ⋮ |
| MCALp | cntq-p | ially to nonvolatile memory devices, and more particularly to nonvolatile memory modules and/or electronic devices including the nonvolatile memory module.

NONVOLATILE MEMORY DEVICES INCLUDING CONTROLLER FOR OPERATING NONVOLATILE MEMORY CELL ARRAY LAYER IN MEMORY CHIP IN ONE OF MEMORY MODE AND STORAGE MODE

CROSS-REFERENCE TO RELATED APPLICATION(S)

This application claims priority under 35 USC §119 to Korean Patent Application No. 10-2015-0162601, filed on Nov. 19, 2015 in the Korean Intellectual Property Office (KIPO), the contents of which are herein incorporated by reference in their entirety.

BACKGROUND

1. Technical Field

Example embodiments relate to semiconductor memory devices, and more particularly to nonvolatile memory modules and/or electronic devices including the nonvolatile memory module.

2. Description of the Related Art

Semiconductor memory devices for storing data may be classified into, for example, volatile memory devices and nonvolatile memory devices. The volatile memory devices are typically configured to store data by charging or discharging capacitors in memory cells, and are widely used as main memories of various apparatuses. The volatile memory devices such as Dynamic Random Access Memory (DRAM) and Static Random Access Memory (SRAM) retain stored data while power is supplied and lose the stored data when power is off.

The non-volatile memory devices such as flash memory devices may maintain stored data even though power is off, and are widely used for storing program codes and/or data in computers, mobile devices, etc.

According to demands for higher memory capacity, faster operation speed and lower power consumption of the memory devices, new memory devices of various types have been developed to realize high integration density of DRAM, fast speed of SRAM and non-volatility of flash memory in a single memory device. For example, Phase Change Random Access Memory (PRAM) using phase change materials, Resistance Random Access Memory (RRAM) using materials having variable resistance such as transition-metal oxides, and Magnetic Random Access Memory (MRAM) using ferromagnetism materials have been receiving attention as memory devices of next generation. The materials constituting the next generation memory devices have some characteristics in common. For example, resistances of such materials vary depending on magnitude and/or direction of applied voltage and/or current. The resistances of such materials can be maintained (meaning non-volatility) even when the applied voltage and/or current is cut off, and thus a refresh operation may not be used for the memory formed based on such materials.

Each memory cell of the resistive memory devices may be formed with one resistive element and one switching element so that data may be stored by controlling voltage and/or current of a bit line and a word line to change resistance of the resistive element.

Due to the advantages of the resistive memory devices, the resistive memory devices have been widely considered in various apparatuses.

SUMMARY

Some example embodiments are directed to provide nonvolatile memory modules that are able to operate in various modes.

Some example embodiments are directed to provide nonvolatile memory modules that operate at a higher speed with increased reliability.

Some example embodiments are directed to provide electronic devices including the aforementioned nonvolatile memory module.

According to an example embodiment, a nonvolatile memory module includes a plurality of memory chips and a module controller. The plurality of memory chips are disposed on a printed circuit board (PCB), each of the plurality of memory chips includes a plurality of nonvolatile memory cell array layers stacked on a substrate in a three dimensional structure. The module controller is disposed on the PCB, and is configured to control operations of the plurality of memory chips. The module controller is configured to operate each of the plurality of nonvolatile memory cell array layers included in each of the plurality of memory chips in one of a memory mode, in which a corresponding nonvolatile memory cell array layer is used as a working memory area that temporarily stores data for an operation of the nonvolatile memory module, and a storage mode, in which the corresponding nonvolatile memory cell array layer is used as a storage area that preserves data.

According to an example embodiment, a nonvolatile memory module includes a plurality of memory chips and a module controller. The plurality of memory chips are disposed on a printed circuit board (PCB), each of the plurality of memory chips includes a plurality of nonvolatile memory cell array layers stacked on a substrate in a three dimensional structure. The module controller is disposed on the PCB, and is configured to control operations of the plurality of memory chips. The module controller is configured to determine a nonvolatile memory cell array layer, on which a write operation is to be performed next time, from among the plurality of nonvolatile memory cell array layers included in each of the plurality of memory chips based on a number of write operations consecutively performed on each of the plurality of nonvolatile memory cell array layers.

According to an example embodiment, a nonvolatile memory device includes a memory chip including a plurality of nonvolatile memory cell array layers, the plurality of nonvolatile memory cell array layers stacked in a three dimensional structure, and a controller configured to operate each of the plurality of nonvolatile memory cell array layers in one of a memory mode or a storage mode, the memory mode being a mode in which a corresponding one of the plurality of nonvolatile memory cell array layers is used as a working memory area that temporarily stores data for an operation of the nonvolatile memory device, the storage mode being a mode in which a corresponding one of the plurality of nonvolatile memory cell array layers is used as a storage area that preserves data.

BRIEF DESCRIPTION OF THE DRAWINGS

Illustrative, non-limiting example embodiments will be more clearly understood from the following detailed description in conjunction with the accompanying drawings.

FIG. 10 is a diagram illustrating an example of a configuration information table included in the module controller of FIG. 9.

FIG. 11 is a diagram illustrating another example of a configuration information table included in the module controller of FIG. 9.

FIG. 14 is a diagram illustrating an example of a write to read same cell access time table included in the module controller of FIG. 12.

FIG. 17 is a diagram illustrating an example of a consecutive write information table included in the module controller of FIG. 16.

DETAILED DESCRIPTION

In some example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of arrays of memory cells having an active area disposed above the substrate and circuitry associated with the operation of those memory cells, whether such associated circuitry is above or within such substrate. The layers of each level of the array may be directly deposited on the layers of each underlying level of the array. The term "monolithic" means that layers of each level of the array are directly deposited on the layers of each underlying level of the array.

In some example embodiments, the 3D memory array may include vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
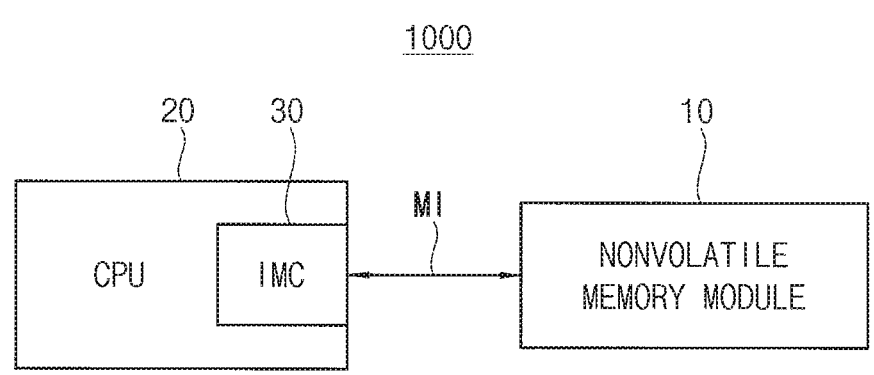
FIG. 1 is a block diagram illustrating an electronic device according to an example embodiment.

FIG. 1 is a block diagram illustrating an electronic device according to an example embodiment.

Referring to FIG. 1, an electronic device 1000 includes a nonvolatile memory module 10 and a central processing unit (CPU) 20.

Although the electronic device 1000 is illustrated to include one nonvolatile memory module 10 in FIG. 1 for ease of explanation, the electronic device 1000 may include more than two nonvolatile memory modules 10.

The nonvolatile memory module 10 may include a plurality of nonvolatile memory chips. Therefore, the nonvolatile memory module 10 may maintain stored data although power is off.

The CPU 20 may include a memory controller IMC 30 controlling operations of the nonvolatile memory module 10.

As illustrated in FIG. 1, the memory controller 30 may be included in the CPU 20. The memory controller 30 included in the CPU 20 may be referred to as an integrated memory controller (IMC).

However, according to some example embodiments, the memory controller 30 and the CPU 20 may be separately formed.

The memory controller 30 may be coupled to the nonvolatile memory module 10 through a memory interface MI. The memory interface MI may be implemented with a single channel including a plurality of signal lines, or may bay be implemented with multiple channels, to each of which at least one nonvolatile memory module 10 may be coupled.

As described above, because the nonvolatile memory module 10 includes the plurality of nonvolatile memory chips, the nonvolatile memory module 10 may be used as both a working memory area, which temporarily stores data desired for an operation of the CPU 20, and a storage area, which preserves programs and/or data.

An operation of the nonvolatile memory module 10 will be described later.

Figure 2:
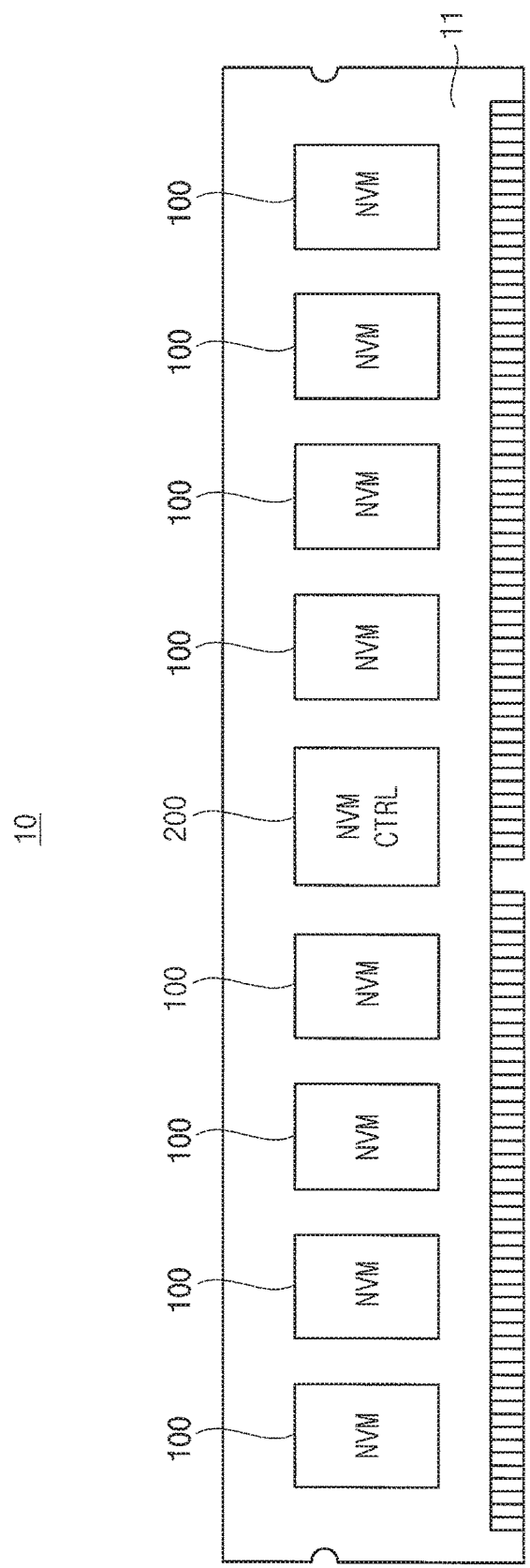
FIG. 2 is a diagram illustrating an example of a nonvolatile memory module included in the electronic device of FIG. 1.

FIG. 2 is a diagram illustrating an example of a nonvolatile memory module included in the electronic device of FIG. 1.

Referring to FIG. 2, the nonvolatile memory module 10 may include a plurality of nonvolatile memory chips NVM 100 and a module controller NVM CTRL 200.

As illustrated in FIG. 2, the plurality of nonvolatile memory chips 100 may be disposed on a printed circuit board (PCB) 11, and the module controller 200 may be disposed in the middle of the plurality of nonvolatile memory chips 100 on the PCB 11.

In some example embodiments, the plurality of nonvolatile memory chips 100 and the module controller 200 may be disposed on the PCB 11 according to a nonvolatile dual in-line memory module (NVDIMM) standard.

Each of the plurality of nonvolatile memory chips 100 may include a plurality of nonvolatile memory cells.

In some example embodiments, each of the plurality of nonvolatile memory chips 100 may have a three dimensional (3D) structure in which the plurality of nonvolatile memory cells are vertically oriented such that at least one memory cell is located over another memory cell.

The module controller 200 may be coupled to the memory controller 30 through the memory interface MI. The module controller 200 may receive a command signal, an address signal, and/or data from the memory controller 30 through the memory interface MI, and control operations of the plurality of nonvolatile memory chips 100 by providing the command signal, the address signal, and/or the data to at least one of the plurality of nonvolatile memory chips 100.

In some example embodiments, data transmission lines between the module controller 200 and the plurality of nonvolatile memory chips 100 may be coupled in a point-to-point topology. Command transmission lines and address transmission lines between the module controller 200 and the plurality of nonvolatile memory chips 100 may be coupled in a multi-drop topology, a daisy-chain topology, a fly-by daisy-chain topology, or the like. According to example embodiments, the command transmission lines and the address transmission lines between the module controller 200 and the plurality of nonvolatile memory chips 100 may be coupled in a point-to-point topology.

As described above, because the module controller 200 buffers the command signal, the address signal, and the data, which are received from the memory controller 30, and provides the command signal, the address signal, and the data to the plurality of nonvolatile memory chips 100, the memory controller 30 may interface with the nonvolatile memory module 10 by driving only a load of the module controller 200. Accordingly, the electronic device 1000 may include a plurality of nonvolatile memory modules 10 operating under a control of the memory controller 30.

Figure 3:
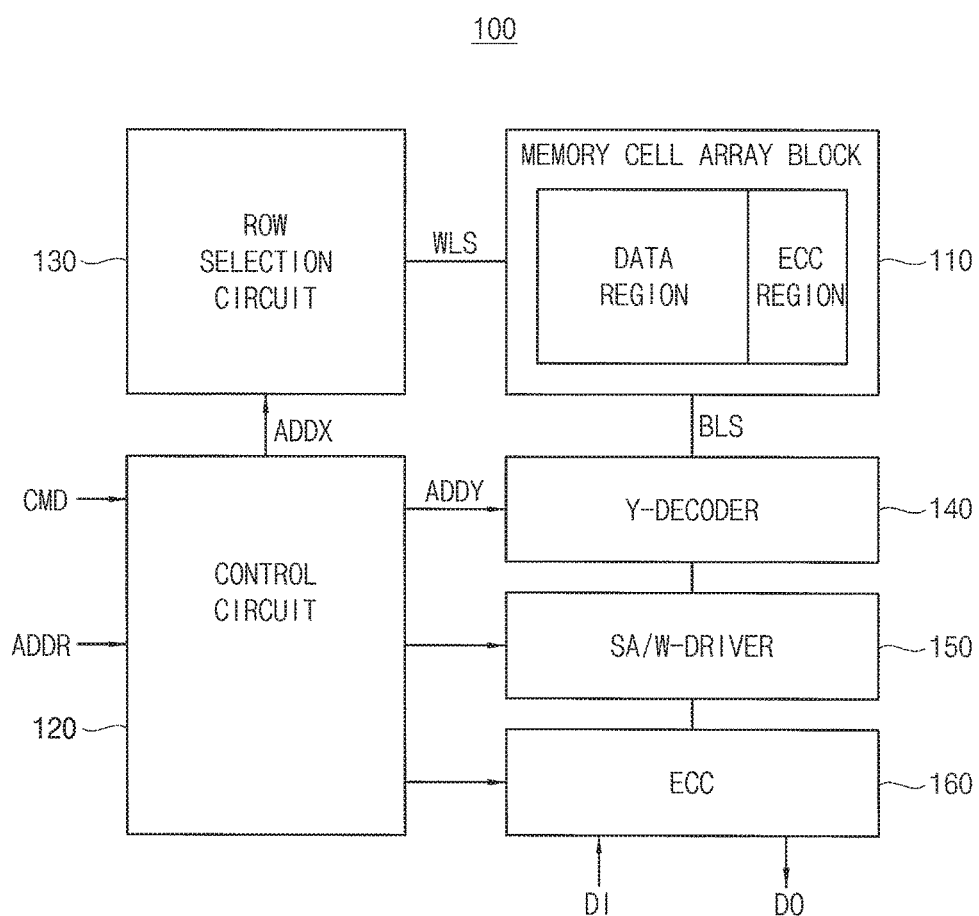
FIG. 3 is a block diagram illustrating an example of a nonvolatile memory chip included in the nonvolatile memory module of FIG. 2.

FIG. 3 is a block diagram illustrating an example of a nonvolatile memory chip included in the nonvolatile memory module of FIG. 2.

Each of the plurality of nonvolatile memory chips 100 included in the nonvolatile memory module 10 of FIG. 2 may be implemented with a nonvolatile memory chip 100 of FIG. 3.

Referring to FIG. 3, the nonvolatile memory chip 100 may include a nonvolatile memory cell array block 110, a control circuit 120, a row selection circuit 130, a column decoder Y-DECODER 140, an input/output circuit 150, and an error check and correction (ECC) engine 160. Although some elements desired for describing inventive concepts are illustrated in FIG. 3, the nonvolatile memory chip 100 may further include an address buffer, an input/output buffer, a pre-decoder, and other peripheral circuits.

The nonvolatile memory cell array block 110 may be coupled to the row selection circuit 130 through a plurality of word lines WLS, and be coupled to the column decoder 140 through a plurality of bit lines BLS.

The nonvolatile memory cell array block may include a plurality of resistive memory cells coupled to the plurality of word lines WLS and the plurality of bit lines BLS. Each of the plurality of resistive memory cells may have a resistance varying based on a logic level of a stored data.

In some example embodiments, the nonvolatile memory cell array block 110 may be divided into a data region for storing data and an ECC code region for storing an ECC code. In this case, the plurality of resistive memory cells may be divided into data cells in the data region for storing the data and ECC code cells in the ECC code region for storing the ECC code.

The plurality of resistive memory cells may be selected by the row selection circuit 130 through the plurality of word lines WLS.

In some example embodiments, the nonvolatile memory cell array block 110 may have a three dimensional (3D) structure in which the plurality of resistive memory cells are vertically oriented such that at least one resistive memory cell is located over another resistive memory cell.

Figure 4:
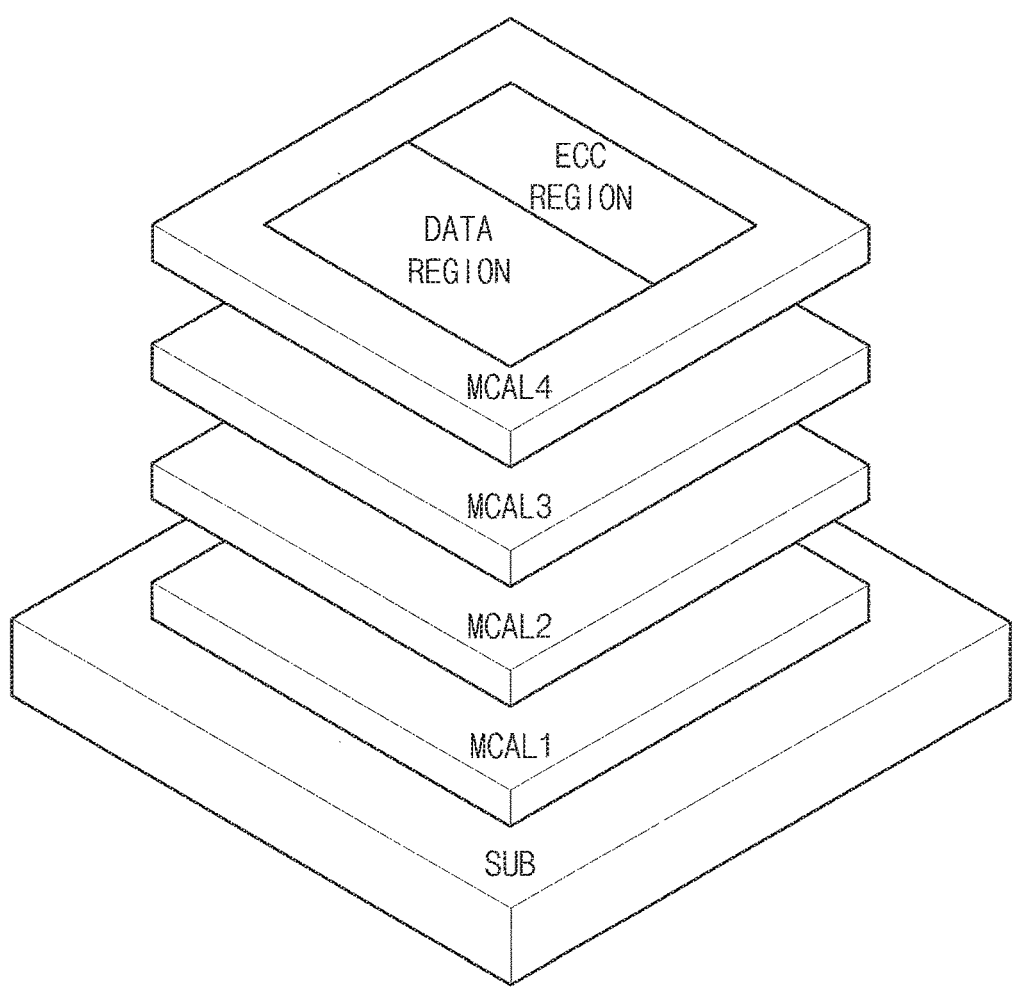
FIG. 4 is a diagram illustrating a three dimensional structure of the nonvolatile memory chip of FIG. 3.

FIG. 4 is a diagram illustrating a three dimensional structure of the nonvolatile memory chip of FIG. 3.

As illustrated in FIG. 4, the nonvolatile memory chip 100 may include a plurality of nonvolatile memory cell array layers MCAL1, MCAL2, MCAL3, and MCAL4 stacked on a substrate SUB in a three dimensional structure.

Each of the plurality of nonvolatile memory cell array layers MCAL1, MCAL2, MCAL3, and MCAL4 may include a nonvolatile memory cell array having the plurality of resistive memory cells. Further, the plurality of resistive memory cells included in each of the plurality of nonvolatile memory cell array layers MCAL1, MCAL2, MCAL3, and MCAL4 may be divided into the data cells in the data region for storing the data and the ECC code cells in the ECC code region for storing the ECC code.

Figure 5:
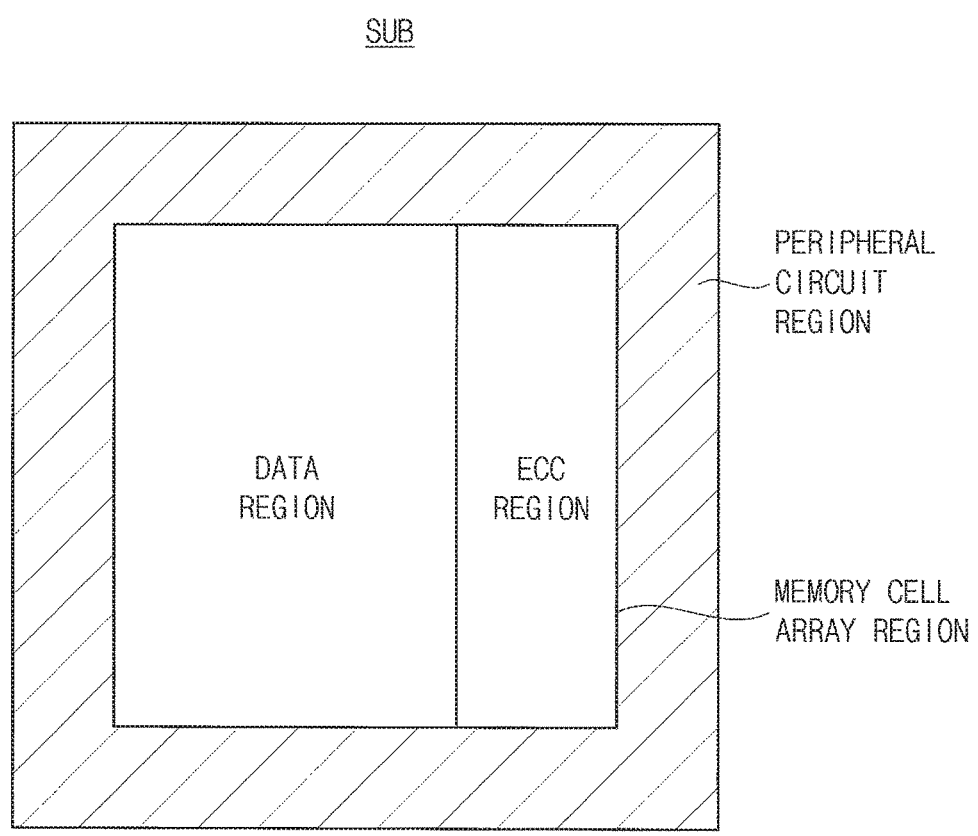
FIG. 5 is a diagram illustrating an example of a substrate included in the nonvolatile memory chip of FIG. 4.

FIG. 5 is a diagram illustrating an example of a substrate included in the nonvolatile memory chip of FIG. 4.

As illustrated in FIG. 5, a middle area of the substrate SUB, which faces the plurality of nonvolatile memory cell array layers MCAL1, MCAL2, MCAL3, and MCAL4, may correspond to a memory cell array region in which the nonvolatile memory cell array having the plurality of resistive memory cells is formed, and a peripheral area of the substrate SUB, which surrounds the middle area, may correspond to a peripheral circuit region in which peripheral circuits, such as the control circuit 120, the row selection circuit 130, the column decoder 140, the input/output circuit 150, and the ECC engine 160, are formed.

The nonvolatile memory cell array block 110 may include the nonvolatile memory cell arrays formed on the plurality of nonvolatile memory cell array layers MCAL1, MCAL2, MCAL3, and MCAL4, which are provided on the middle area of the substrate SUB.

Figure 6:
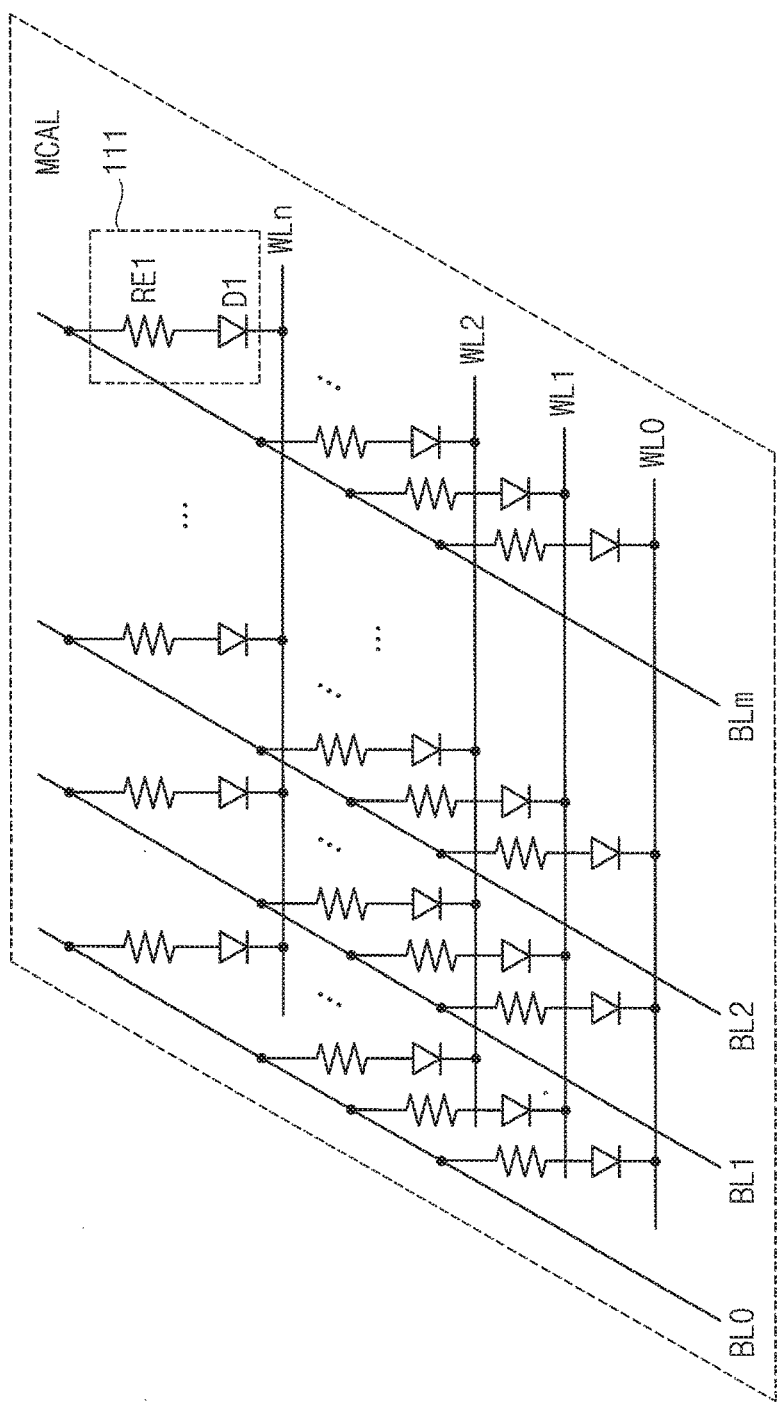
FIG. 6 is a circuit diagram illustrating an example of a nonvolatile memory cell array layer included in the nonvolatile memory chip of FIG. 4.

FIG. 6 is a circuit diagram illustrating an example of a nonvolatile memory cell array layer included in the nonvolatile memory chip of FIG. 4.

Each of the plurality, of nonvolatile memory cell array layers MCAL1, MCAL2, MCAL3, and MCAL4 included in the nonvolatile memory chip 100 of FIG. 4 may be implemented with a nonvolatile memory cell array layer MCAL of FIG. 6.

Referring to FIG. 6, a plurality of bit lines BL0~BLm and a plurality of word lines WL0~WLn may be formed on the nonvolatile memory cell array layer MCAL.

The nonvolatile memory cell array layer MCAL may have a cross-point structure, and one resistive memory cell may be formed at each intersections of the plurality of bit lines BL0~BLm and the plurality of word lines WL0~WLn.

As illustrated in FIG. 6, the resistive memory cell 111 may include a resistive element RE1 and a diode D1 coupled in series between a corresponding word line WL and a corresponding bit line BL.

A resistance distribution of the resistive element RE1 may be controlled by a voltage between the corresponding word line WL and the corresponding bit line BL. In some example embodiments, a write operation may be performed on the resistive memory cell 111 by applying voltages between the corresponding word line WL and the corresponding bit line BL, thereby controlling a voltage difference between both ends of the resistive element RE1 or controlling a current flowing through the resistive element RE1.

Figure 7:
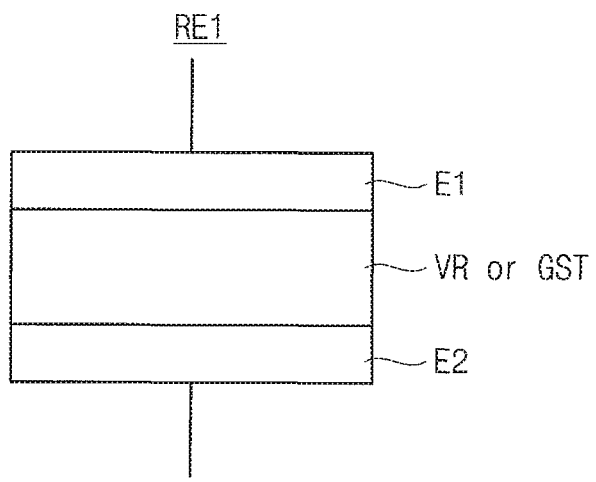
FIG. 7 is a diagram illustrating an example of a resistive element included in a resistive memory cell of FIG. 6.

FIG. 7 is a diagram illustrating an example of a resistive element included in a resistive memory cell of FIG. 6.

Referring to FIG. 7, the resistive element RE1 may include a first electrode E1, a second electrode E2, and resistive material between the first electrode E1 and the second electrode E2. The first electrode E1 and the second electrode E2 may be formed with metal (e.g., tantalum (Ta) or platinum (Pt)). The resistive material may include transition-metal oxide (VR) such as cobalt oxide, or phase change material such as GeSbTe (GST). The phase change material may be in amorphous state or in crystalline state depending on heating time and/or heating temperature, and thus the phase change material may change its resistance according to phase change.

Although phase change random access memory (PRAM) using phase change materials, resistance random access memory (RRAM) using materials having variable resistance, and magnetic random access memory (MRAM) using ferromagnetism materials may be differentiated from each other, those may be totally referred to as resistive memories. The nonvolatile memory chip 100 according to example embodiments may be implemented with various resistive memories including PRAM, RRAM and MRAM.

Figure 8:
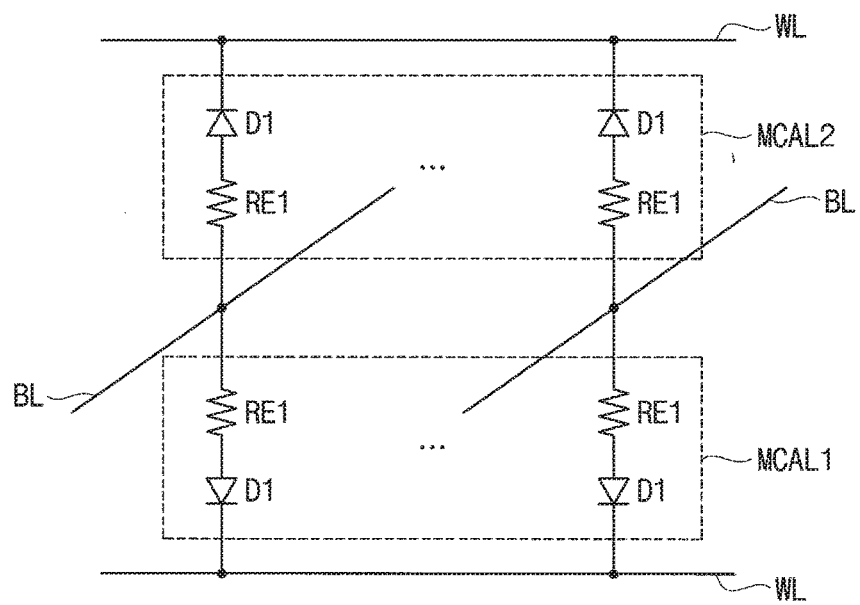
FIG. 8 is a circuit diagram illustrating another example of a nonvolatile memory cell array layer included in the nonvolatile memory chip of FIG. 4.

FIG. 8 is a circuit diagram illustrating another example of a nonvolatile memory cell array layer included in the nonvolatile memory chip of FIG. 4.

In FIG. 8, two nonvolatile memory cell array layers MCAL1 and MCAL2, which are stacked consecutively, are illustrated.

As illustrated in FIG. 8, each of the nonvolatile memory cell array layers MCAL1 and MCAL2 may have a cross-point structure, and one resistive memory cell may be formed at an intersection of a bit line BL and a word line WL.

A resistive memory cell formed on each of the nonvolatile memory cell array layers MCAL1 and MCAL2 of FIG. 8 is the same as the resistive memory cell formed on the nonvolatile memory cell array layer MCAL of FIG. 6.

However, as illustrated in FIG. 8, the nonvolatile memory cell array layers MCAL1 and MCAL2, which are stacked consecutively, may share one bit line BL.

Therefore, when the nonvolatile memory cell array block 110 is implemented with the nonvolatile memory cell array layers MCAL1 and MCAL2 of FIG. 8, a size of the nonvolatile memory cell array block 110 may be decreased.

Referring again to FIG. 3, the control circuit 120 may receive the command signal CMD and the address signal ADDR from the module controller 200 included in the nonvolatile memory module 10, and control a write operation, a read operation, and an erase operation of the nonvolatile memory chip 100 based on the command signal CMD and the address signal ADDR.

For example, the control circuit 120 may generate timing control signals such as a write enable signal, a read enable signal, a sense enable signal, etc., based on the command signal CMD. Further, the control circuit 120 may generate a row address ADDX and a column address ADDY based on the address signal ADDR.

The control circuit 120 may provide the timing control signals to the row selection circuit 130, the column decoder 140, and the input/output circuit 150 to control the write operation, the read operation, and the erase operation of the nonvolatile memory chip 100. In addition, the control circuit 120 may provide the row address ADDX to the row selection circuit 130 and provide the column address ADDY to the column decoder 140.

The row selection circuit 130 may be coupled to the nonvolatile memory cell array block 110 through the plurality of word lines WLS. The row selection circuit 130 may select one of the plurality of word lines WLS based on the row address ADDX to perform the write operation or the read operation.

The column decoder 140 may be coupled to the nonvolatile memory cell array block 110 through the plurality of bit lines BLS. The column decoder 140 may select one of the plurality of bit lines BLS based on the column address ADDY and connect the selected bit line to the input/output circuit 150.

The input/output circuit 150 may include a sense amplifier SA and a write driver W-DRIVER.

During the write operation, the ECC engine 160 may receive write data DI from the module controller 200, and generate an ECC code based on the write data DI.

The write driver may receive the write data DI and the ECC code corresponding to the write data DI from the ECC engine 160, and write the write data DI and the ECC code in the data cells and the ECC code cells, respectively, included in the plurality of nonvolatile memory cell array layers MCAL1, MCAL2, MCAL3, and MCAL4.

During the read operation, the sense amplifier SA may sense voltage or current of a bit line BL formed by the nonvolatile memory cell array block 110 to generate read data DO and the ECC code, and provide the read data DO and the ECC code to the ECC engine 160.

The ECC engine 160 may detect and correct an error of the read data. DO based on the read data DO and the ECC code received from the sense amplifier SA. The control circuit 120 may control operations of the ECC engine 160 such as code generation, error detection and error correction.

The read data DO outputted by the ECC engine 160 may be provided to the module controller 200.

In some example embodiments, the ECC code may be a parity check code, a Hamming code, etc. For example, the parity check code may be determined such that ECC calculation may result in a constant value, in which the ECC calculation may be an exclusive-OR operation on each bit of the read data DO and each bit of the parity check code. The result of the ECC calculation may be "1" in case of an odd parity type, or "0" in case of an even parity type. The ECC engine 160 may determine that the read data DO includes an error if the result of the ECC calculation is different from a predetermined value, and correct the error to output the corrected data. As a number of bits included in the ECC code increases, a number of error bits that the ECC engine 160 is able to correct may increase while a cell overhead also increases. Therefore, the number of bits included in the ECC code may be determined based on a desired error correction performance.

As described above with reference to FIGS. 1 to 8, because the nonvolatile memory module 10 includes the plurality of nonvolatile memory chips 100 having the plurality of resistive memory cells, the nonvolatile memory module 10 may be used as both a working memory area, which temporarily stores data desired for an operation of the CPU 20, and a storage area, which preserves programs and/or data.

Figure 9:
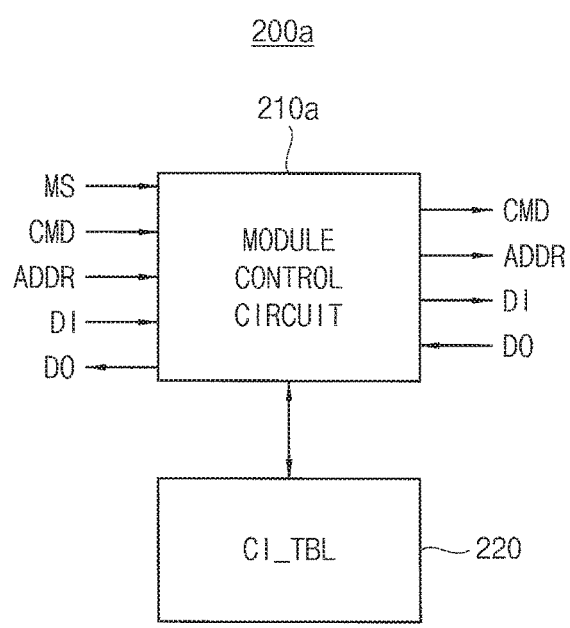
FIG. 9 is a block diagram illustrating an example of a module controller included in the nonvolatile memory module of FIG. 2.

FIG. 9 is a block diagram illustrating an example of a module controller included in the nonvolatile memory module of FIG. 2.

Referring to FIG. 9, a module controller 200a may include a module control circuit 210a and a configuration information table CI_TBL 220.

The module control circuit 210a may operate each of the plurality of nonvolatile memory cell array layers MCAL1, MCAL2, MCAL3, and MCAL4 included in each of the plurality of nonvolatile memory chips 100 in one of a memory mode, in which a corresponding nonvolatile memory cell array layer is used as a working memory area, and a storage mode, in which the corresponding nonvolatile memory cell array layer is used as a storage area.

FIG. 10 is a diagram illustrating an example of a configuration information table included in the module controller of FIG. 9.

As illustrated in FIG. 10, a configuration information table 220a may store an operation mode OP_MD of each of the plurality of nonvolatile memory cell array layers MCAL1, MCAL2, MCAL3, and MCAL4 included in each of the plurality of nonvolatile memory chips 100. In FIG. 10, the configuration information table 220a is illustrated to store whether the operation mode OP_MD of each of first through p-th nonvolatile memory cell array layers MCAL1~MCALp included in each of first through q-th memory chips NVM1~NVMq is the memory mode MEM_MD or the storage mode STR_MD as an example.

Referring again to FIG. 9, when the memory controller 30 wants to use the nonvolatile memory module 10 as the working memory area to temporarily store data desired for an operation of the CPU 20 in the nonvolatile memory module 10, the memory controller 30 may provide the command signal CMD, the address signal ADDR, and the write data DI together with a mode signal MS having a first logic level to the module control circuit 210a.

When the module control circuit 210a receives the mode signal MS having the first logic level from the memory controller 30, the module control circuit 210a may write the write data DI in a nonvolatile memory cell array layer, which operates in the memory mode MEM_MD, among the plurality of nonvolatile memory cell array layers MCAL1, MCAL2, MCAL3, and MCAL4 included in each of the plurality of nonvolatile memory chips 100 based on the configuration information table 220.

When the memory controller 30 wants to use the nonvolatile memory module 10 as the storage area to preserve data (e.g., a program code or a multimedia data) in the nonvolatile memory module 10, the memory controller 30 may provide the command signal CMD, the address signal ADDR, and the write data DI together with the mode signal MS having a second logic level to the module control circuit 210a.

When the module control circuit 210a receives the mode signal MS having the second logic level from the memory controller 30, the module control circuit 210a may write the write data DI in a nonvolatile memory cell array layer, which operates in the storage mode STR_MD, among the plurality of nonvolatile memory cell array layers MCAL1, MCAL2, MCAL3, and MCAL4 included in each of the plurality of nonvolatile memory chips 100 based on the configuration information table 220.

In some example embodiments, the configuration information table 220 may be initialized such that the operation mode OP_MD of each of the plurality of nonvolatile memory cell array layers MCAL1, MCAL2, MCAL3, and MCAL4 included in each of the plurality of nonvolatile memory chips 100 is set as the memory mode MEM_MD when the nonvolatile memory module 10 is manufactured.

In this case, at an initial use of the nonvolatile memory module 10, the module control circuit 210a may operate each of the plurality of nonvolatile memory cell array layers MCAL1, MCAL2, MCAL3, and MCAL4 included in each of the plurality of nonvolatile memory chips 100 in the memory mode MEM_MD.

After that, while performing a normal operation, the module control circuit 210a may determine the operation mode OP_MD of each of the plurality of nonvolatile memory cell array layers MCAL1, MCAL2, MCAL3, and MCAL4 included in each of the plurality of nonvolatile memory chips 100 as one of the memory mode MEM_MD and the storage mode STR_MD based on an endurance level of each of the plurality of nonvolatile memory cell array layers MCAL1, MCAL2, MCAL3, and MCAL4 included in each of the plurality of nonvolatile memory chips 100.

For example, because a nonvolatile memory cell array layer MCAL operating in the memory mode MEM_MD requires a higher endurance level than a nonvolatile memory cell array layer MCAL operating in the storage mode STR_MD, the module control circuit 210a may operate a nonvolatile memory cell array layer MCAL having a relatively high endurance level in the memory mode MEM_MD, and operate a nonvolatile memory cell array layer MCAL having a relatively low endurance level in the storage mode STR_MD.

In some example embodiments, the module control circuit 210a may determine the operation mode OP_MD of each of the plurality of nonvolatile memory cell array layers MCAL1, MCAL2, MCAL3, and MCAL4 included in each of the plurality of nonvolatile memory chips 100 as one of the memory mode MEM_MD and the storage mode STR_MD based on a number of write operations performed on each of the plurality of nonvolatile memory cell array layers MCAL1, MCAL2, MCAL3, and MCAL4 included in each of the plurality of nonvolatile memory chips 100.

For example, as illustrated in FIG. 10, the module control circuit 210a may count the number of write operations performed on each of the plurality of nonvolatile memory cell array layers MCAL1, MCAL2, MCAL3, and MCAL4 included in each of the plurality of nonvolatile memory chips 100 to generate a use value USE_V for each of the plurality of nonvolatile memory cell array layers MCAL1, MCAL2, MCAL3, and MCAL4 included in each of the plurality of nonvolatile memory chips 100, and store the use value USE_V in the configuration information table 220a.

The module control circuit 210a may operate a nonvolatile memory cell array layer, which has the use value USE_V smaller than a reference value, among the plurality of nonvolatile memory cell array layers MCAL1, MCAL2, MCAL3, and MCAL4 included in each of the plurality of nonvolatile memory chips 100 in the memory mode MEM_MD, and operate a nonvolatile memory cell array layer, which has the use value USE_V equal to or greater than the reference value, among the plurality of nonvolatile memory cell array layers MCAL1, MCAL2, MCAL3, and MCAL4 included in each of the plurality of nonvolatile memory chips 100 in the storage mode STR_MD. In some example embodiments, the reference value may be pre-stored in the module controller 200a. In other example embodiments, the reference value may be provided from the memory controller 30.

When the operation mode OP_MD of a nonvolatile memory cell array layer MCAL is changed from the memory mode MEM_MD to the storage mode STR_MD, the module control circuit 210a may copy data stored in the nonvolatile memory cell array layer MCAL to another nonvolatile memory cell array layer MCAL operating in the memory mode MEM_MD, and then operate the nonvolatile memory cell array layer MCAL in the storage mode STR_MD.

In other example embodiments, the module control circuit 210a may determine the operation mode OP_MD of each of the plurality of nonvolatile memory cell array layers MCAL1, MCAL2, MCAL3, and MCAL4 included in each of the plurality of nonvolatile memory chips 100 as one of the memory mode MEM_MD and the storage mode STR_MD based on a number of erase operations performed on each of the plurality of nonvolatile memory cell array layers MCAL1, MCAL2, MCAL3, and MCAL4 included in each of the plurality of nonvolatile memory chips 100.

For example, as illustrated in FIG. 10, the module control circuit 210a may count the number of erase operations performed on each of the plurality of nonvolatile memory cell array layers MCAL1, MCAL2, MCAL3, and MCAL4 included in each of the plurality of nonvolatile memory chips 100 to generate a use value USE_V for each of the plurality of nonvolatile memory cell array layers MCAL1, MCAL2, MCAL3, and MCAL4 included in each of the plurality of nonvolatile memory chips 100, and store the use value USE_V in the configuration information table 220a.

The module control circuit 210a may operate a nonvolatile memory cell array layer, which has the use value USE_V smaller than a reference value, among the plurality of nonvolatile memory cell array layers MCAL1, MCAL2, MCAL3, and MCAL4 included in each of the plurality of nonvolatile memory chips 100 in the memory mode MEM_MD, and operate a nonvolatile memory cell array layer, which has the use value USE_V equal to or greater than the reference value, among the plurality of nonvolatile memory cell array layers MCAL1, MCAL2, MCAL3, and MCAL4 included in each of the plurality of nonvolatile memory chips 100 in the storage mode STR_MD. In some example embodiments, the reference value may be pre-stored in the module controller 200a. In other example embodiments, the reference value may be provided from the memory controller 30.

When the operation mode OP_MD of a nonvolatile memory cell array layer MCAL is changed from the memory mode MEM_MD to the storage mode STR_MD, the module control circuit 210a may copy data stored in the nonvolatile memory cell array layer MCAL to another nonvolatile memory cell array layer MCAL operating in the memory mode MEM_MD, and then operate the nonvolatile memory cell array layer MCAL in the storage mode STR_MD.

FIG. 11 is a diagram illustrating another example of a configuration information table included in the module controller of FIG. 9.

Comparing with the configuration information table 220a of FIG. 10, a configuration information table 220b of FIG. 11 may further store initial endurance level END_V of each of the plurality of nonvolatile memory cell array layers MCAL1, MCAL2, MCAL3, and MCAL4 included in each of the plurality of nonvolatile memory chips 100.

For example, the initial endurance level END_V of each of the plurality of nonvolatile memory cell array layers MCAL1, MCAL2, MCAL3, and MCAL4 included in each of the plurality of nonvolatile memory chips 100 may be determined through a test process performed when the nonvolatile memory module 10 is manufactured.

In this case, the module control circuit 210a may count the number of at least one of write operations or erase operations performed on each of the plurality of nonvolatile memory cell array layers MCAL1, MCAL2, MCAL3, and MCAL4 included in each of the plurality of nonvolatile memory chips 100 to generate a use value USE_V for each of the plurality of nonvolatile memory cell array layers MCAL1, MCAL2, MCAL3, and MCAL4 included in each of the plurality of nonvolatile memory chips 100, and store the use value USE_V in the configuration information table 220b.

The module control circuit 210a may determine the operation mode OP_MD of each of the plurality of nonvolatile memory cell array layers MCAL1, MCAL2, MCAL3, and MCAL4 included in each of the plurality of nonvolatile memory chips 100 as one of the memory mode MEM_MD and the storage mode STR_MD based on the initial endurance level END_V and the use value USE_V of each of the plurality of nonvolatile memory cell array layers MCAL1, MCAL2, MCAL3, and MCAL4 included in each of the plurality of nonvolatile memory chips 100.

For example, as illustrated in FIG. 11, the module control circuit 210a may operate a nonvolatile memory cell array layer, which has a ratio of the use value USE_V to the initial endurance level END_V smaller than a reference ratio, among the plurality of nonvolatile memory cell array layers MCAL1, MCAL2, MCAL3, and MCAL4 included in each of the plurality of nonvolatile memory chips 100 in the memory mode MEM_MD, and operate a nonvolatile memory cell array layer, which has the ratio of the use value USE_V to the initial endurance level END_V equal to or greater than the reference ratio, among the plurality of nonvolatile memory cell array layers MCAL1, MCAL2, MCAL3, and MCAL4 included in each of the plurality of nonvolatile memory chips 100 in the storage mode STR_MD. In some example embodiments, the reference ratio may be pre-stored in the module controller 200a. In other example embodiments, the reference ratio may be provided from the memory controller 30.

As described above with reference to FIGS. 1 to 11, in the nonvolatile memory module 10 according to the example embodiments, each of the plurality of nonvolatile memory cell array layers MCAL1, MCAL2, MCAL3, and MCAL4 included in each of the plurality of nonvolatile memory chips 100 may be selectively used as one of the working memory area and the storage area. Therefore, according to the example embodiments, a utilization of the nonvolatile memory module 10 may be effectively increased.

Figure 12:
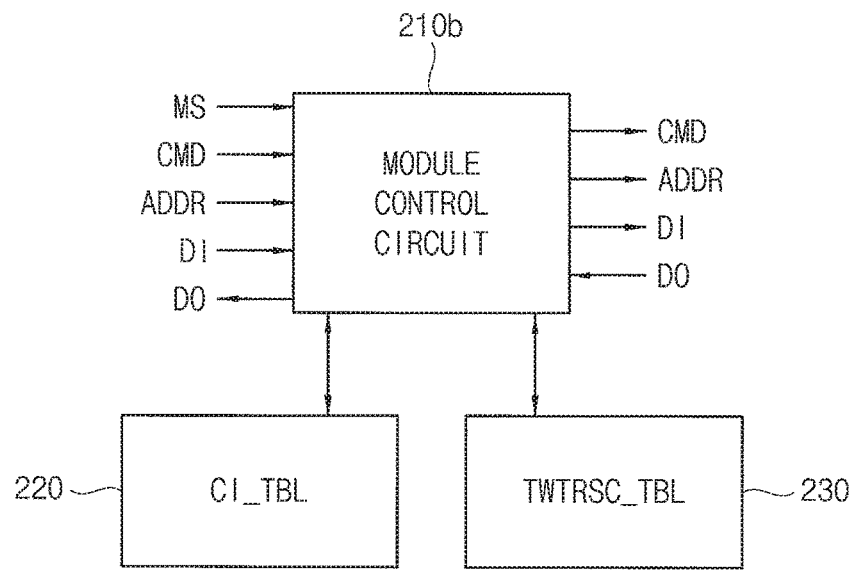
FIG. 12 is a block diagram illustrating another example of a module controller included in the nonvolatile memory module of FIG. 2.

FIG. 12 is a block diagram illustrating another example of a module controller included in the nonvolatile memory module of FIG. 2.

Referring to FIG. 12, a module controller 200b may include a module control circuit 210b, a configuration information table CI_TBL 220, and a write to read same cell access time table TWTRSC_TBL 230.

The module controller 200b of FIG. 12 is the same as the module controller 200a of FIG. 9 except that the module controller 200b of FIG. 12 further includes the write to read same cell access time table 230. Therefore, duplicated description will be omitted and only operations related with the write to read same cell access time table 230 will be described.

As described above with reference to FIG. 7, the resistive element RE1 included in each of the plurality of nonvolatile memory cell array layers MCAL1, MCAL2, MCAL3, and MCAL4 may include the phase change material. The phase change material may be in the amorphous state or in the crystalline state depending on heating time and/or heating temperature, and thus the phase change material may change its resistance according to phase change. Therefore, a write operation may be performed by changing a voltage of the bit line BL based on a logic level of the write data DI such that the phase change material is set to the amorphous state or the crystalline state.

Figure 13:
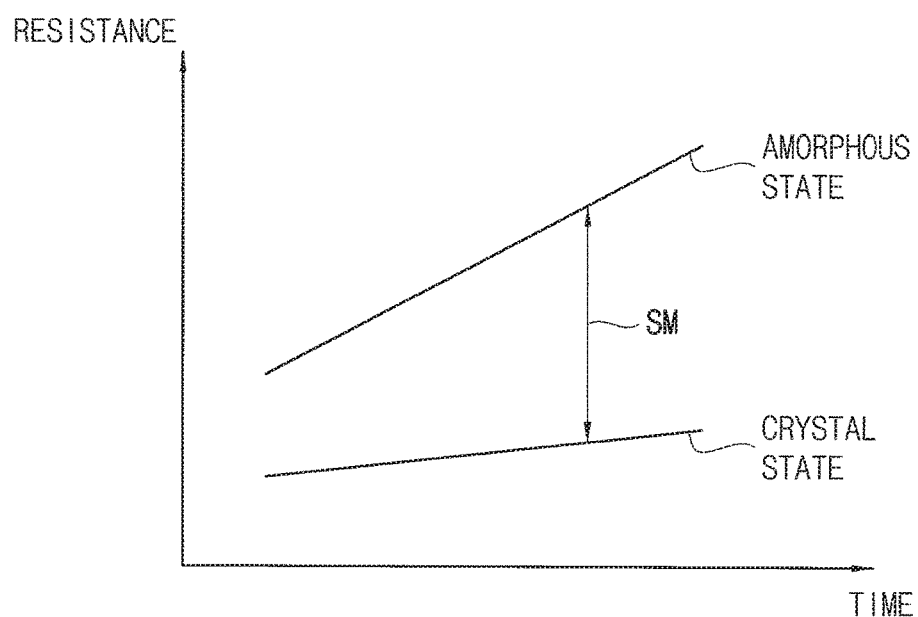
FIG. 13 is a diagram illustrating a change of a resistance of phase change material according to time.

FIG. 13 is a diagram illustrating a change of a resistance of phase change material according to time.

In FIG. 13, x-axis represents time, and y-axis represents a resistance of the phase change material.

As illustrated in FIG. 13, when the phase change material is set to the crystalline state by the write operation, a resistance of the phase change material may increase slowly according to time. On the other hand, when the phase change material is set to the amorphous state by the write operation, a resistance of the phase change material may increase rapidly according to time.

Therefore, a sensing margin SM, which corresponds to a difference between a resistance of the phase change material set to the crystalline state and a resistance of the phase change material set to the amorphous state, may be relatively small right after the write operation is performed, and increase as time flows.

If a read operation is performed when the sensing margin SM is small, a read error may occur. Therefore, to mitigate or prevent the read error, the read operation may be desired to be performed on a resistive memory cell 111 after a write to read same cell access time (tWTRSC) from a time at which the write operation is performed on the resistive memory cell 111. Here, the write to read same cell access time (tWTRSC) represents a minimum time interval between a write operation and a read operation performed on the same resistive memory cell 111.

FIG. 14 is a diagram illustrating an example of a write to read same cell access time table included in the module controller of FIG. 12.

As illustrated in FIG. 14, the write to read same cell access time table 230 may store the write to read same cell access time (tWTRSC) of each of the plurality of nonvolatile memory cell array layers MCAL1, MCAL2, MCAL3, and MCAL4 included in each of the plurality of nonvolatile memory chips 100.

For example, the write to read same cell access time (tWTRSC) of each of the plurality of nonvolatile memory cell array layers MCAL1, MCAL2, MCAL3, and MCAL4 included in each of the plurality of nonvolatile memory chips 100 may be determined through a test process performed when the nonvolatile memory module 10 is manufactured.

The module control circuit 210b may control operations of the plurality of nonvolatile memory cell array layers MCAL1, MCAL2, MCAL3, and MCAL4 based on the write to read same cell access time table 230 such that a time interval between a write operation and a read operation performed on a same resistive memory cell may be greater than the write to read same cell access time (tWTRSC) of a corresponding nonvolatile memory cell array layer MCAL, which includes the same resistive memory cell.

For example, the module control circuit 210b may control operations of the plurality of nonvolatile memory cell array layers MCAL1, MCAL2, MCAL3, and MCAL4 based on the write to read same cell access time table 230 such that the read operation may be performed on a first resistive memory cell after the write to read same cell access time (tWTRSC) of a corresponding nonvolatile memory cell array layer MCAL, which includes the first resistive memory cell, from a time at which the write operation is performed on the first resistive memory cell.

As described above with reference to FIGS. 12 to 14, the module controller 200b may manage the write to read same cell access time (tWTRSC) for each of the plurality of nonvolatile memory cell array layers MCAL1, MCAL2, MCAL3, and MCAL4 included in each of the plurality of nonvolatile memory chips 100 separately. Therefore, the nonvolatile memory module 10 according to the example embodiments may effectively increase an operation speed while maintaining operation reliability.

Figure 15:
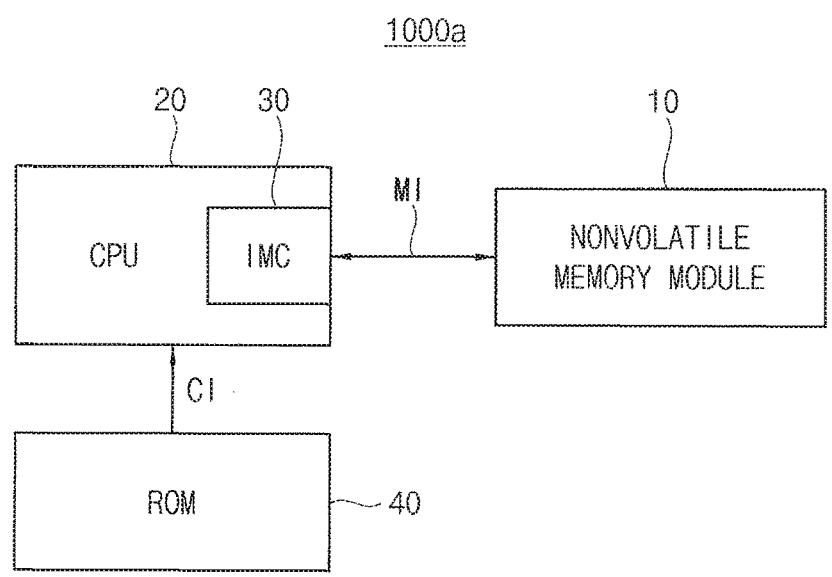
FIG. 15 is a block diagram illustrating an example of the electronic device of FIG. 1.

FIG. 15 is a block diagram illustrating an example of the electronic device of FIG. 1.

Comparing with the electronic device 1000 of FIG. 1, an electronic device 1000a of FIG. 15 further includes a read only memory ROM 40.

The ROM 40 may store configuration information CI, which represents the operation mode OP_MD of each of the plurality of nonvolatile memory cell array layers MCAL1, MCAL2, MCAL3, and MCAL4 included in each of the plurality of nonvolatile memory chips 100.

The CPU 20 may read the configuration information CI from the ROM 40 at an initial stage of power-up, and provide the configuration information CI to the module controller 200 included in the nonvolatile memory module 10 through the memory controller 30.

In this case, the module controller 200 may operate each of the plurality of nonvolatile memory cell array layers MCAL1, MCAL2, MCAL3, and MCAL4 included in each of the plurality of nonvolatile memory chips 100 in one of the memory mode MEM_MD and the storage mode STR_MD based on the configuration information CI.

Figure 16:
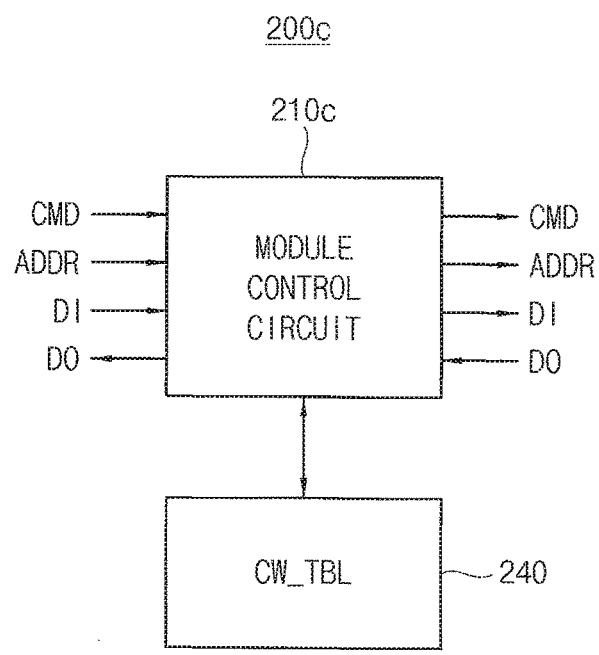
FIG. 16 is a block diagram illustrating another example of a module controller included in the nonvolatile memory module of FIG. 2.

FIG. 16 is a block diagram illustrating another example of a module controller included in the nonvolatile memory module of FIG. 2.

Referring to FIG. 16, a module controller 200c may include a module control circuit 210c and a consecutive write information table CW_TBL 240.

If the module control circuit 210c performs consecutive write operations on the plurality of nonvolatile memory cell array layers MCAL1, MCAL2, MCAL3, and MCAL4 in a distributed manner, a delay time may occur to change the memory cell array layers on which the write operation is performed. On the other hand, if the module control circuit 210c performs consecutive write operations on a single nonvolatile memory cell array layer MCAL from among the plurality of nonvolatile memory cell array layers MCAL1, MCAL2, MCAL3, and MCAL4, an overall operation speed may be increased because the delay time may not occur or may be reduced.

Therefore, when the module control circuit 210c receives consecutive write commands from the memory controller 30, the module control circuit 210c may consecutively performs write operations, which correspond to the consecutive write commands, on one nonvolatile memory cell array layer MCAL selected from among the plurality of nonvolatile memory cell array layers MCAL1, MCAL2, MCAL3, and MCAL4.

However, if a lot of write operations are performed consecutively on a same nonvolatile memory cell array layer, temperature of the same nonvolatile memory cell array layer may increase and a write error may occur.

Therefore, the module control circuit 210c may determine a nonvolatile memory cell array layer MCAL, on which a write operation is to be performed next time, among the plurality of nonvolatile memory cell array layers MCAL1, MCAL2, MCAL3, and MCAL4 included in each of the plurality of nonvolatile memory chips 100 based on a number of write operations consecutively performed on each of the plurality of nonvolatile memory cell array layers MCAL1, MCAL2, MCAL3, and MCAL4.

FIG. 17 is a diagram illustrating an example of a consecutive write information table included in the module controller of FIG. 16.

As illustrated in FIG. 17, the consecutive write information table 240 may store the number CW of write operations consecutively performed on each of the plurality of nonvolatile memory cell array layers MCAL1, MCAL2, MCAL3, and MCAL4 included in each of the plurality of nonvolatile memory chips 100.

When the module control circuit 210c receives consecutive write commands from the memory controller 30, the module control circuit 210c may consecutively perform write operations, which correspond to the consecutive write commands, on a first nonvolatile memory cell array layer selected from among the plurality of nonvolatile memory cell array layers MCAL1, MCAL2, MCAL3, and MCAL4 while the module control circuit 210c counts the number CW of write operations performed on the first nonvolatile memory cell array layer and store the counted number CW in the consecutive write information table 240.

When the counted number CW equals to a reference value, the module control circuit 210c may stop performing a write operation on the first nonvolatile memory cell array layer and perform rest of the write operations corresponding to the consecutive write commands on a second nonvolatile memory cell array layer, which is different from the first nonvolatile memory cell array layer, among the plurality of nonvolatile memory cell array layers MCAL1, MCAL2, MCAL3, and MCAL4.

As described above with reference to FIGS. 16 and 17, the module controller 200c may consecutively perform write operations on one nonvolatile memory cell array layer selected from among the plurality of nonvolatile memory cell array layers MCAL1, MCAL2, MCAL3, and MCAL4, and, when the number of write operations performed on the one nonvolatile memory cell array layer equals to the reference value, the module controller 200c may consecutively perform write operations on another nonvolatile memory cell array layer. Therefore, the nonvolatile memory module 10 according to the example embodiments may effectively increase an operation speed while maintaining operation reliability.

Figure 18:
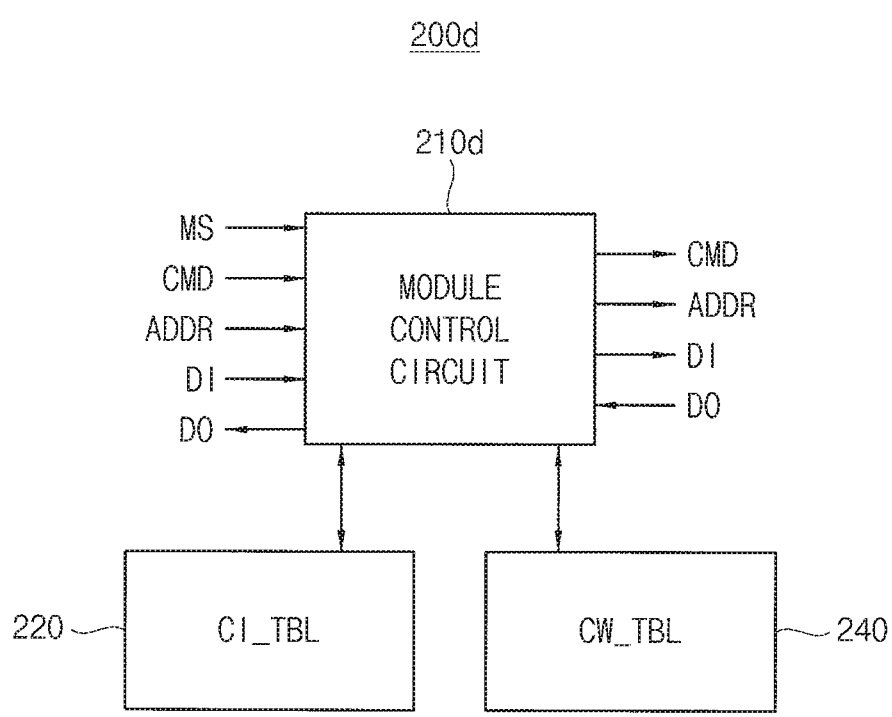
FIG. 18 is a block diagram illustrating another example of a module controller included in the nonvolatile memory module of FIG. 2.

FIG. 18 is a block diagram illustrating another example of a module controller included in the nonvolatile memory module of FIG. 2.

Referring to FIG. 18, a module controller 200d may include a module control circuit 210d, a configuration information table CI_TBL 220, and a consecutive write information table CW_TBL 240.

The module control circuit 210d included in the module controller 200d of FIG. 18 may perform both the operation of the module control circuit 210a included in the module controller 200a of FIG. 9 and the operation of the module control circuit 210c included in the module controller 200c of FIG. 16 using the configuration information table 220 and the consecutive write information table 240.

Operations of the module controller 200a of FIG. 9 and the module controller 200c of FIG. 16 are described above. Therefore, detailed description about the module controller 200d of FIG. 18 will be omitted here.

Figure 19:
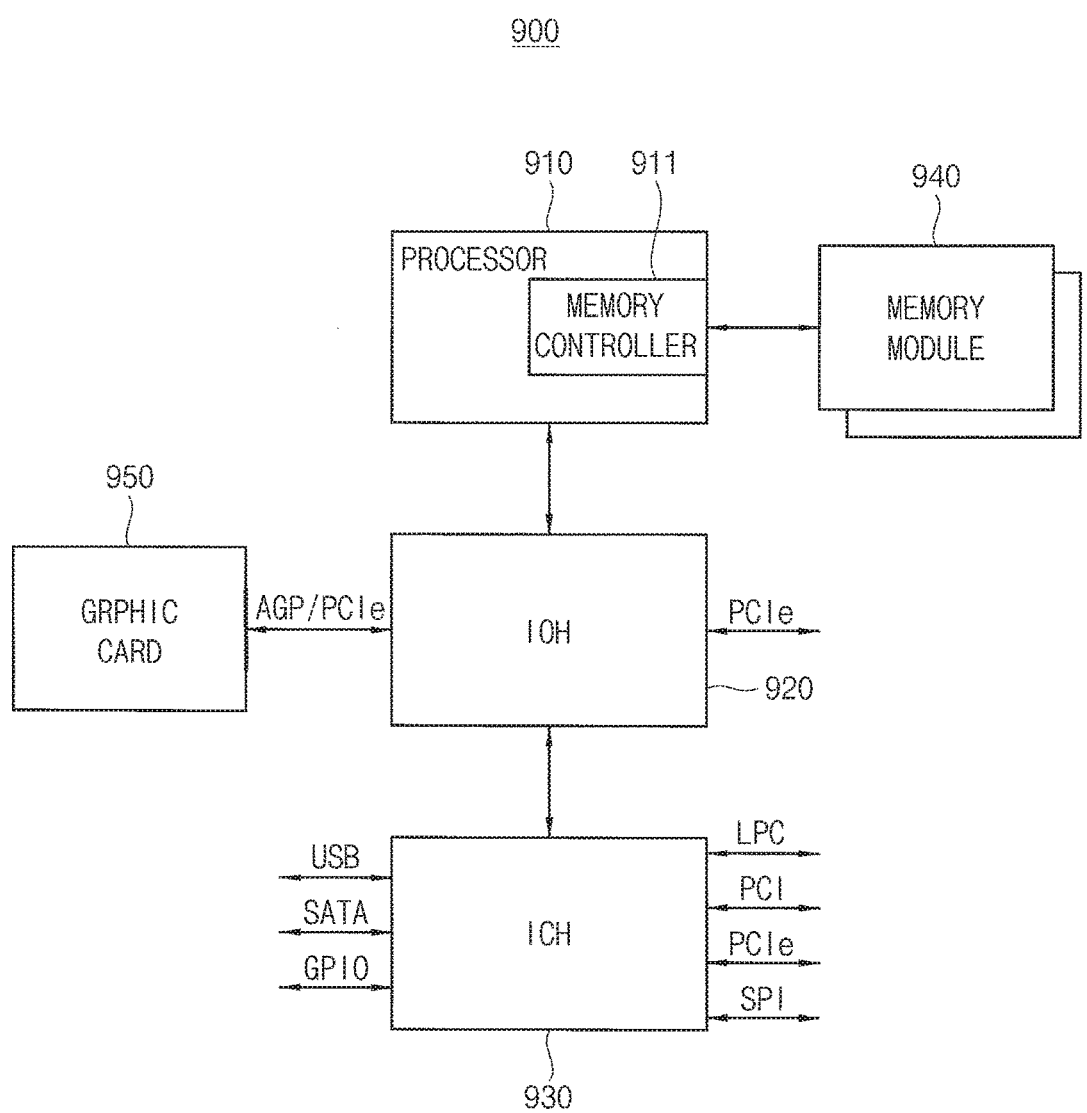
FIG. 19 is a block diagram illustrating a computing system according to an example embodiment.

FIG. 19 is a block diagram illustrating a computing system according to an example embodiment.

Referring to FIG. 19, a computing system 900 includes a processor 910, an input/output hub (IOH) 920, an input/output controller hub (ICH) 930, at least one memory module 940, a graphics card 950, and a voltage regulator 960. In some example embodiments, the computing system 900 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, or the like. In some example embodiments, the processor 910 may include a single core or multiple cores. For example, the processor 910 may be a multi-core processor, such as a dual-core processor, a quad-core processor, a hexa-core processor, etc. Although FIG. 19 illustrates the computing system 900 including one processor 910, in some example embodiments, the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some example embodiments, the memory controller 911 may be located inside the input/output hub 920. The input/output hub 920 including the memory controller 911 may be referred to as memory controller hub (MCH).

The processor 910, the memory controller 911, and the memory module 940 may be implemented with the electronic device 1000 of FIG. 1. A structure and an operation of the electronic device 1000 are described above with reference with FIGS. 1 to 18. Therefore, detained description about the processor 910, the memory controller 911, and the memory module 940 will be omitted here.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a Quick-Path interconnect (QPI), a common system interface (CSI), etc. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc. Although FIG. 19 illustrates the computing system 900 including one input/output hub 920, in some example embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memory device. In some example embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some example embodiments, the processor 910, the input/output hub 920 and the input/output controller hub 930 may be implemented as separate chipsets or separate integrated circuits. In other example embodiments, at least two of the processor 910, the input/output hub 920 and the input/output controller hub 930 may be implemented as a single chipset.

The various controllers and/or processing units described herein may be implemented using hardware components or a combination of software components and hardware component. For example, the hardware components may include microcontrollers, memory modules, sensors, amplifiers, band-pass filters, analog to digital converters, and processing devices, or the like. A processing device may be implemented using one or more hardware device(s) configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device(s) may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors, multi-core processors, distributed processing, or the like.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, and/or computer storage medium or device. The software also may be distributed over network coupled computer systems so that the software is stored and executed in a distributed fashion. The software and data may be stored by one or more computer readable recording mediums.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A nonvolatile memory module, comprising:
   a plurality of memory chips on a printed circuit board (PCB), each of the plurality of memory chips including a plurality of nonvolatile memory cell array layers, the plurality of nonvolatile memory cell array layers stacked on a substrate in a three dimensional structure; and
   a module controller on the PCB, the module controller configured to control operations of the plurality of memory chips, the module controller configured to operate each of the plurality of nonvolatile memory cell array layers included in each of the plurality of memory chips in one of a memory mode and a storage mode, the memory mode being a mode in which a corresponding one of the plurality of nonvolatile memory cell array layers is used as a working memory area that temporarily stores data for an operation of the nonvolatile memory module, the storage mode being a mode in which a corresponding one of the plurality of nonvolatile memory cell array layers is used as a storage area that preserves data,
   wherein the module controller is further configured to,
      pre-store an initial endurance level of each of the plurality of nonvolatile memory cell array layers,
      count a number of at least one of write operations or erase operations performed on each of the plurality of nonvolatile memory cell array layers to generate a use value for each of the plurality of nonvolatile memory cell array layers, and
      operate each of the plurality of nonvolatile memory cell array layers in one of the memory mode and the storage mode based on the initial endurance level and the use value of each of the plurality of nonvolatile memory cell array layers.

2. The nonvolatile memory module of claim 1, wherein the module controller is further configured to,
   operate, in the memory mode, a nonvolatile memory cell array layer, which has a ratio of the use value to the initial endurance level smaller than a reference ratio, from among the plurality of nonvolatile memory cell array layers, and
   operate, in the storage mode, a nonvolatile memory cell array layer, which has the ratio of the use value to the initial endurance level equal to or greater than the reference ratio, from among the plurality of nonvolatile memory cell array layers.

3. A nonvolatile memory module, comprising:
a plurality of memory chips on a printed circuit board (PCB), each of the plurality of memory chips including a plurality of nonvolatile memory cell array layers, the plurality of nonvolatile memory cell array layers stacked on a substrate in a three dimensional structure; and
a module controller on the PCB, the module controller configured to control operations of the plurality of memory chips, the module controller configured to operate each of the plurality of nonvolatile memory cell array layers included in each of the plurality of memory chips in one of a memory mode and a storage mode based on a number of erase operations performed on each of the plurality of nonvolatile memory cell array layers included in each of the plurality of memory chips, the memory mode being a mode in which a corresponding one of the plurality of nonvolatile memory cell array layers is used as a working memory area that temporarily stores data for an operation of the nonvolatile memory module, the storage mode being a mode in which a corresponding one of the plurality of nonvolatile memory cell array layers is used as a storage area that preserves data,
wherein the module controller is further configured to,
  count the number of erase operations performed on each of the plurality of nonvolatile memory cell array layers to generate a use value for each of the plurality of nonvolatile memory cell array layers,
  operate, in the memory mode, a nonvolatile memory cell array layer, which has the use value smaller than a reference value, among the plurality of nonvolatile memory cell array layers, and
  operate, in the storage mode, a nonvolatile memory cell array layer, which has the use value equal to or greater than the reference value, among the plurality of nonvolatile memory cell array layers.

4. A nonvolatile memory module, comprising
a plurality of memory chips on a printed circuit board (PCB), each of the plurality of memory chips including a plurality of nonvolatile memory cell array layers, the plurality of nonvolatile memory cell array layers stacked on a substrate in a three dimensional structure; and
a module controller on the PCB, the module controller configured to control operations of the plurality of memory chips, the module controller configured to operate each of the plurality of nonvolatile memory cell array layers included in each of the plurality of memory chips in one of a memory mode and a storage mode, the memory mode being a mode in which a corresponding one of the plurality of nonvolatile memory cell array layers is used as a working memory area that temporarily stores data for an operation of the nonvolatile memory module, the storage mode being a mode in which a corresponding one of the plurality of nonvolatile memory cell array layers is used as a storage area that preserves data,
wherein each of the plurality of nonvolatile memory cell array layers includes a plurality of resistive memory cells, and each of the plurality of resistive memory cells has a resistance varying based on a logic level of the data stored therein, and
the module controller is further configured to store a write to read same cell access time (tWTRSC) for each of the plurality of nonvolatile memory cell array layers, respectively, the tWTRSC being a minimum time interval between a write operation and a read operation performed on a same resistive memory cell.

5. The nonvolatile memory module of claim 4, wherein the module controller is further configured to control operations of the plurality of nonvolatile memory cell array layers such that the read operation is performed on a first resistive memory cell, which is included in a corresponding nonvolatile memory cell array layer of the plurality of nonvolatile memory cell array layers, after the tWTRSC of the corresponding nonvolatile memory cell array layer from a time at which the write operation is performed on the first resistive memory cell.

6. A nonvolatile memory device, comprising:
a memory chip including a plurality of nonvolatile memory cell array layers, the plurality of nonvolatile memory cell array layers stacked in a three dimensional structure; and
a controller configured to operate each of the plurality of nonvolatile memory cell array layers in one of a memory mode or a storage mode, the memory mode being a mode in which a corresponding one of the plurality of nonvolatile memory cell array layers is used as a working memory area that temporarily stores data for an operation of the nonvolatile memory device, the storage mode being a mode in which a corresponding one of the plurality of nonvolatile memory cell array layers is used as a storage area that preserves data,
wherein the controller is further configured to,
  pre-store an initial endurance level of each of the plurality of nonvolatile memory cell array layers,
  count a number of at least one of write operations or erase operations performed on each of the plurality of nonvolatile memory cell array layers to generate a use value for each of the plurality of nonvolatile memory cell array layers, and
  operate each of the plurality of nonvolatile memory cell array layers in one of the memory mode and the storage mode based on the initial endurance level and the use value of each of the plurality of nonvolatile memory cell array layers.

* * * * *